United States Patent
Jang et al.

(10) Patent No.: US 10,297,789 B2
(45) Date of Patent: May 21, 2019

(54) DISPLAY APPARATUS AND MANUFACTURING METHOD THEREOF

(71) Applicant: Samsung Display Co., Ltd., Yongin, Gyeonggi-Do (KR)

(72) Inventors: Yong-Kyu Jang, Yongin (KR); Chang-Yong Jeong, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/275,379

(22) Filed: May 12, 2014

(65) Prior Publication Data

US 2015/0034920 A1 Feb. 5, 2015

(30) Foreign Application Priority Data

Aug. 1, 2013 (KR) ........................ 10-2013-0091582

(51) Int. Cl.
| | |
|---|---|
| H01L 51/00 | (2006.01) |
| H01L 33/00 | (2010.01) |
| H01L 21/00 | (2006.01) |
| H01J 1/62 | (2006.01) |
| H01J 63/04 | (2006.01) |
| H01J 17/00 | (2006.01) |
| H01L 51/52 | (2006.01) |

(52) U.S. Cl.
CPC ...... H01L 51/5256 (2013.01); H01L 51/5237 (2013.01); H01L 51/5253 (2013.01)

(58) Field of Classification Search
CPC ............. H01L 51/5237; H01L 51/5256; H01L 51/5253
See application file for complete search history.

(56) References Cited

U.S. PATENT DOCUMENTS

| | | | |
|---|---|---|---|
| 2005/0212419 A1* | 9/2005 | Vazan | H01L 51/5256 313/512 |
| 2007/0114519 A1* | 5/2007 | Hayashi | H01L 51/5253 257/40 |
| 2007/0207696 A1* | 9/2007 | Park | C03C 15/00 445/25 |
| 2008/0180022 A1* | 7/2008 | Kwack et al. | 313/504 |
| 2008/0238301 A1* | 10/2008 | Shim et al. | 313/504 |
| 2008/0309226 A1* | 12/2008 | Kim et al. | 313/504 |
| 2010/0187986 A1* | 7/2010 | Kajitani et al. | 313/504 |
| 2010/0232162 A1* | 9/2010 | Shin | H01L 27/322 362/293 |
| 2011/0070672 A1* | 3/2011 | Lee et al. | 438/26 |
| 2012/0062104 A1 | 3/2012 | Kwack et al. | |

(Continued)

FOREIGN PATENT DOCUMENTS

| | | |
|---|---|---|
| KR | 10-2012-0027992 | 3/2012 |
| KR | 10-2012-0057286 | 6/2012 |
| KR | 10-2012-0065049 | 6/2012 |

*Primary Examiner* — Fernando L Toledo
*Assistant Examiner* — Aaron J Gray
(74) *Attorney, Agent, or Firm* — Innovation Counsel LLP

(57) ABSTRACT

A display apparatus may include a substrate. The display apparatus may further include a display unit that includes an emission layer and is disposed on the substrate. The display apparatus may further include a protective layer that overlaps the display unit. The display apparatus may further include an organic layer that is disposed between the display unit and the protective layer. A top surface area of the organic layer may be equal to or less than a top surface area of the protective layer.

16 Claims, 3 Drawing Sheets

(56) References Cited

U.S. PATENT DOCUMENTS

| | | |
|---|---|---|
| 2012/0133275 A1 | 5/2012 | Lee et al. |
| 2012/0146492 A1 | 6/2012 | Ryu et al. |
| 2012/0208306 A1* | 8/2012 | Haas et al. ............... 438/26 |
| 2013/0092972 A1* | 4/2013 | Kim ............... H01L 51/5256 |
| | | 257/100 |
| 2014/0179041 A1* | 6/2014 | Huh ............ H01L 21/67207 |
| | | 438/28 |

* cited by examiner

DISPLAY APPARATUS AND MANUFACTURING METHOD THEREOF

RELATED APPLICATIONS

This application claims the benefit of Korean Patent Application No. 10-2013-0091582, filed on Aug. 1, 2013, in the Korean Intellectual Property Office, the disclosure of which is incorporated herein in its entirety by reference.

BACKGROUND

1. Field

The present invention is related to a display apparatus and a manufacturing method thereof.

2. Description of the Related Art

A display apparatus may include display unit that includes a light emission layer and therefore may be self-emitting. The display unit may need to be sufficiently separated from an environment that surrounds the display apparatus. For example, an organic light-emitting display apparatus may include an organic light-emitting device that includes a hole injection electrode, an electron injection electrode, and an organic emission layer disposed between the electrodes and configured to emit light. The organic light-emitting device may need to be sealed for protection from moisture, oxygen, etc. in an environment surrounding the organic light-emitting display apparatus.

SUMMARY

Embodiments of the present invention may be related to a display device (e.g., an organic light-emitting display apparatus) that includes a display unit and has an encapsulation structure for effectively protecting the display unit from moisture. Embodiments of the present invention may be related to a method for manufacturing the display device.

An embodiment of the present invention may be related to a display apparatus that may include a substrate. The display apparatus may further include a display unit that includes an emission layer (e.g., an organic light-emitting layer) and is disposed on the substrate. The display apparatus may further include a first protective layer that overlaps the display unit. The display apparatus may further include a first organic layer that is disposed between the display unit and the first protective layer. A surface area of the first organic layer may be equal to or less than a surface area of the first protective layer.

The top surface area of the first organic layer may be substantially equal to the top surface area of the first protective layer.

A side surface of the first organic layer may be flush with and/or aligned with a side surface of the first protective layer.

The first protective layer may be formed of a material that may include at least one of silicon nitride ($SiN_x$), silicon oxide ($SiO_x$), and aluminum oxide ($Al_2O_3$).

The display apparatus may include a first inorganic layer that covers the first protective layer.

The first inorganic layer may directly contact the substrate, the first protective layer, and the first organic layer.

The first protective layer may not directly contact the substrate.

The top surface area of the first protective layer may be less than a top surface area of the first inorganic layer.

The display apparatus may include a second inorganic layer, which may overlap the first inorganic layer. The display apparatus may further include a second organic layer disposed between the first inorganic layer and the second inorganic layer.

The display apparatus may include a second protective layer disposed between the second inorganic layer and the second organic layer. The second inorganic layer may directly contact the first inorganic layer, the second organic layer, and the second protective layer.

The display apparatus may include a metal layer disposed between the display unit and the first organic layer.

The metal layer contacts at least two surfaces of the first organic layer. The two surfaces may be at an angle less than 180 degrees with respect to each other.

The metal layer may include at least one of lithium fluoride (LiF) and aluminum oxide ($AlO_x$).

An embodiment of the present invention may be related to a display apparatus that may include the following elements: a substrate; a display unit that includes an emission layer and is disposed on the substrate; an inorganic layer that covers the display unit; a protective layer disposed between the display unit and the inorganic layer; and an organic layer disposed between the display unit and the protective layer. The inorganic layer may contact both the protective layer and the organic layer.

An embodiment of the present invention may be related to a method for manufacturing a display apparatus. The method may include the following steps: forming a display unit on a substrate, the display unit including an emission layer; forming a first organic material layer that overlaps the display unit and the substrate; forming a first protective layer that covers a first portion of the first organic material layer without covering a second portion of the first organic material layer; and removing the second portion of the first organic material layer using the first protective layer as a mask to form a first organic layer, the first organic layer corresponding to the first portion of the first organic material layer, wherein the display apparatus includes the first protective layer.

The method may include the following step: forming a first inorganic layer such that the first inorganic layer contacts the substrate and the first protective layer, wherein the first protective layer and the first organic layer may be disposed between the substrate and the first inorganic layer.

The method may include the following steps: forming a second organic material layer on the first inorganic layer; forming a second protective layer, the second protective layer covering a first portion of the second organic material layer without covering a second portion of the second organic material layer; and removing the second portion of the second organic material layer using the second protective layer as a mask to form a second organic layer, the second organic layer corresponding to the first portion of the second organic material layer, wherein the display apparatus includes the second protective layer.

The method may include the following step: forming a second inorganic layer, the second inorganic layer contacting the first inorganic layer and the second protective layer, wherein the second protective layer and the second organic layer may be disposed between the first inorganic layer and the second inorganic layer.

The method may include the following step: before the step of forming the first organic material layer, forming a metal layer that covers the display unit.

The metal layer may contact at least two sides of the display unit.

An embodiment of the present invention may be related to an organic light-emitting display apparatus that may include the following elements: a substrate; a display unit formed on the substrate; and a thin-film encapsulation (TFE) layer configured to encapsulate the display unit, wherein the TFE layer includes a first organic layer, a protective layer formed on the first organic layer, and a first inorganic layer that covers the protective layer, wherein the protective layer defines a shape and/or an area of the first organic layer, and wherein an area (e.g., top area) of the protective layer may be substantially equal to an analogous area (e.g., top area) of the first organic layer.

A side surface of the protective layer and a side surface of the first organic layer may be continuously formed, i.e., flush and/or aligned.

The protective layer may include at least one of silicon nitride ($SiN_x$), silicon oxide ($SiO_x$), and aluminum oxide ($Al_2O_3$).

The organic light-emitting display apparatus may include the following elements: a second organic layer disposed on the first inorganic layer; and a second inorganic layer that covers the second organic layer.

The organic light-emitting display apparatus may include a second protective layer disposed between the second organic layer and the second inorganic layer, the second protective layer defining a shape and/or an area of the second organic layer.

The organic light-emitting display apparatus may include a metal layer disposed between the display unit and the first organic layer, the metal layer covering the display unit.

The metal layer may include at least one of lithium fluoride (LiF) and aluminum oxide ($AlO_x$).

An area (e.g., top area) of the protective layer may be less than an area (e.g., top area) of the first inorganic layer.

An embodiment of the present invention may be related to an organic light-emitting display apparatus that may include the following elements: a substrate; a display unit formed on the substrate; and a thin-film encapsulation (TFE) layer configured to encapsulate the display unit, wherein the TFE layer includes a plurality of organic layers, a plurality of inorganic layers alternately stacked (or disposed) with the plurality of organic layers, and a protective layer formed on the upper surface of at least the lowest one of the organic layers. The protective layer may be formed of a material that includes at least one of silicon nitride ($SiN_x$), silicon oxide ($SiO_x$), and aluminum oxide ($Al_2O_3$).

The protective layer may define a shape and/or an area (e.g., top area) of the lowest organic layer, and an area of the protective layer may be substantially equal to an analogous area of the lowest organic layer.

A side surface of the protective layer and a side surface of the lowest organic layer may be continuously formed.

A protective layer may be formed on the upper surface of each of the plurality of organic layers.

The organic light-emitting display apparatus may include a metal layer formed directly on the display unit, the metal layer covering the display unit.

The metal layer may include at least one of lithium fluoride (LiF) and aluminum oxide ($AlO_x$).

An area of the protective layer may be less than an analogous area of each of the plurality of inorganic layers.

An embodiment of the present invention may be related to a method for manufacturing an organic light-emitting display apparatus. The method may include the following steps: forming a display unit on a substrate; and forming a thin-film encapsulation (TFE) layer for encapsulating the display unit. The forming of the TFE layer may include the following steps: forming a first organic layer on the display unit; forming a protective layer on the first organic layer; removing a portion of the first organic layer; and forming a first inorganic layer to cover the protective layer. An area of the first organic layer may be substantially equal to an analogous area of the protective layer.

The protective layer may include at least one of silicon nitride ($SiN_x$), silicon oxide ($SiO_x$), and aluminum oxide ($Al_2O_3$).

A portion of the first organic layer that is formed outside the protective layer (i.e., not covered by the protective layer) may be removed by an ashing process with the protective layer functioning as a mask.

The method may include the following steps: forming a second organic layer on the first inorganic layer; and forming a second inorganic layer to cover the second organic layer.

The method may include the following steps before the step of forming the second inorganic layer: forming a second protective layer on the second organic layer; and removing a portion of the second organic layer, wherein an area of the second organic layer may be substantially equal to an analogous area of the second protective layer.

The method may include the following step before the steps of forming the first organic layer: forming a metal layer that covers the display unit.

DETAILED DESCRIPTION

Figure 1:
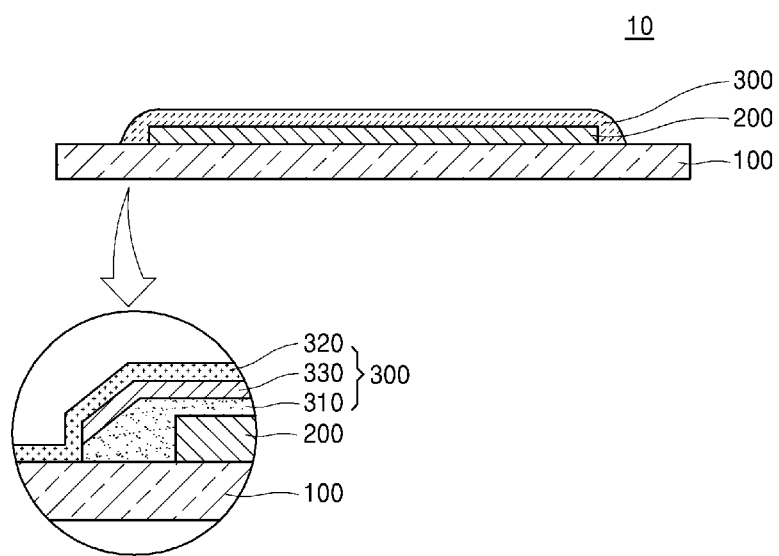
FIG. 1 is a cross-sectional view illustrating a display apparatus (e.g., an organic light-emitting display apparatus) according to an embodiment of the present invention.

Examples of embodiments of in the present invention are described with reference to the accompanying drawings, wherein like reference numerals may refer to identical and/or analogous elements. Embodiments of the invention may have different forms and should not be construed as being limited to the description set forth herein.

As used herein, the term "and/or" may include any and all combinations of one or more of the associated items. Expressions such as "at least one of," when preceding a list of elements, modify the entire list of elements and do not modify the individual elements of the list.

Although the terms "first", "second", etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms "first", "second", etc. may also be used herein to differentiate different categories of elements. For conciseness, the terms "first", "second", etc. may represent "first-type (or first-category)", "second-type (or second-category)", etc., respectively.

In the description, the term "connect" may mean "electrically connect"; the term "insulate" may mean "electrically insulate"; the term "conductive" may mean "electrically conductive".

Figure 2:
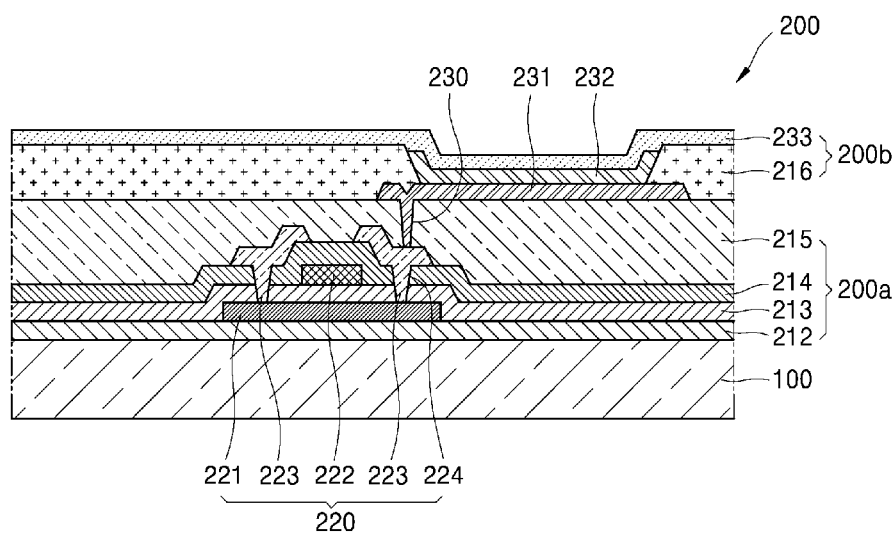
FIG. 2 is a cross-sectional view illustrating a display unit of the display apparatus illustrated in FIG. 1 according to an embodiment of the present invention.

FIG. 1 is a cross-sectional view illustrating a display apparatus 10, e.g., an organic light-emitting display apparatus 10, according to an embodiment of the present invention. FIG. 2 is a cross-sectional view illustrating a display unit 200, e.g., an organic light-emitting display device 200, of the organic light-emitting display apparatus 10.

Referring to FIGS. 1 and 2, the organic light-emitting display apparatus 10 may include a substrate 100, the display unit 200 formed on the substrate 100, and an encapsulation layer 300 that may substantially encapsulate the display unit 200.

The substrate 100 may be a flexible substrate and may be formed of plastic having sufficient heat resistance and durability. The plastic may include, for example, at least one of polyimide, polyethylene terephthalate (PET), polycarbonate, polyethylene naphthalate, polyarylate (PAR), polyetherimide, etc. In an embodiment, the substrate 100 may be formed of one or more of various materials, such as a metal, glass, and the like.

As illustrated in FIG. 2, the display unit 200 may include a thin-film transistor (TFT) layer 200a and a pixel part 200b. The pixel part 200b may be or may include an emission device, e.g., an organic light-emitting device.

The TFT layer 200a may include or may be disposed on a buffer layer 212. The TFT layer 200a may include a thin-film transistor (TFT) 220 disposed on the buffer layer 212. The buffer layer 212 may be formed on the substrate 100. The buffer layer 212 may prevent infiltration of impurity elements from contaminating the TFT 220 and/or may provide a planarized surface on the substrate 100.

The buffer layer 212 may be formed of one or more of various materials capable of performing one or more of these protection and planarization functions. In an embodiment, the buffer layer 212 may include an inorganic material, such as one or more of silicon oxide, silicon nitride, silicon oxynitride, aluminum oxide, aluminum nitride, titanium oxide, titanium nitride, or the like, or an organic material, such as polyimide, polyester, acryl, etc. In an embodiment, the buffer layer 212 may include stacked layers formed of some of different materials.

In an embodiment, the TFT 220 may have a top-gate TFT structure, as illustrated in FIG. 2. In an embodiment, the TFT 220 may have a structure other than the top-gate TFT structure.

The TFT 220 may include an active layer 221, a gate electrode 222, a source electrode 223a, and a drain electrode 223b.

The active layer 221 may be formed of a semiconductor material and may be formed on the buffer layer 212. A gate insulating layer 213 may cover the active layer 221. The active layer 221 may be an inorganic semiconductor, such as amorphous silicon or polysilicon, or an organic semiconductor. The active layer 221 may include a source area, a drain area, and a channel area disposed between the source area and the drain area. The gate insulating layer 213 may electrically insulate the active layer 221 from the gate electrode 222 and may be formed of an organic material or an inorganic material, such as silicon nitride ($SiN_x$) or silicon oxide ($SiO_2$).

The gate electrode 222 may be formed on the gate insulating layer 213. An interlayer insulating layer 214 may cover the gate electrode 222.

The gate electrode 222 may include gold (Au), silver (Ag), copper (Cu), nickel (Ni), platinum (Pt), palladium (Pd), aluminum (Al), or molybdenum (Mo) or an alloy, such as an Al-neodymium (Nd) alloy, a Mo-tungsten (W) alloy, or the like. In an embodiment, the gate electrode 222 may be formed of one or more of various conductive materials.

The interlayer insulating layer 214 may be disposed between the gate electrode 222 and at least one of the source electrode 223a and the drain electrode 223b to provide electrical insulation. The interlayer insulating layer 214 may be formed of an inorganic material, such as $SiN_x$, $SiO_2$, or the like.

The source electrode 223a and the drain electrode 223b may be formed on the interlayer insulating layer 214. Holes 224 may be formed through the interlayer insulating layer 214 and the gate insulating layer 213 to expose the source area and the drain area of the active layer 221, such that the source electrode 223a and the drain electrode 223b may respectively contact the exposed source area and the drain area.

FIG. 2 illustrates a top-gate TFT structure, in which the active layer 221 is disposed between the gate electrode 222 and the substrate 100. In an embodiment, the gate electrode 222 may be disposed between the active layer 221 and the substrate 100.

The TFT 220 may be electrically connected to the pixel part 200b to drive (i.e., control) the pixel part 200b. The TFT 220 may be protected and/or covered by a planarization layer 215.

The planarization layer 215 may be or may include an inorganic insulating layer and/or an organic insulating layer. In an embodiment, the planarization layer 215 is an inorganic insulating layer, and the planarization layer 215 may include at least one of $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), lead zirconate titanate (PZT), etc. In an embodiment, the planarization layer 215 is an organic insulating layer, and the planarization layer 215 may include at least one of a general-use polymer (e.g., polymethylmethacrylate (PMMA) or polystyrene (PS)), a polymer derivative having a phenol group, an acryl group polymer, an imide group polymer, an aryl ether group polymer, an amide group polymer, a fluorine group polymer, a p-xylene group polymer, a vinyl alcohol group polymer, a blend thereof, etc. The planarization layer 215 may have a composite stacked structure that includes one or more inorganic insulating layers and/or one or more organic insulating layers.

The pixel part 200b may be formed on the planarization layer 215 and may include a pixel electrode 231, an intermediate layer 232, and an opposite electrode 233.

In an embodiment, the organic light-emitting display apparatus 10 may be a top-emission-type apparatus. The pixel electrode 231 is formed on the planarization layer 215 and is electrically connected to one of the source electrode 233a and the drain electrode 223b through a contact hole 230 formed in the planarization layer 215.

The pixel electrode 231 may be a reflective electrode and may include a reflective layer formed of one or more of Ag, magnesium (Mg), Al, Pt, Pd, Au, Ni, Nd, iridium (Ir), chromium (Cr), and a compound of some of these materials. The pixel electrode 231 may further include a transparent or translucent electrode layer formed on the reflective layer. The transparent or translucent electrode layer may include at least an indium tin oxide (ITO), an indium zinc oxide (IZO), a zinc oxide (ZnO), an indium oxide ($In_2O_3$), an indium gallium oxide (IGO), and an aluminum zinc oxide (AZO).

The opposite electrode 233, which overlaps the pixel electrode 231, may be a transparent or translucent electrode and may include a metallic thin film having a small work function. In an embodiment, the opposite electrode 233 may include at least one of lithium (Li), calcium (Ca), lithium fluoride (LiF)/Ca, LiF/Al, Al, Mg, and a compound of some of these materials. An auxiliary electrode layer and/or a transparent bus electrode may be formed on the metallic thin film.

The opposite electrode 233 may transmit light that is emitted by an organic emission layer included in the intermediate layer 232. The light emitted by the organic emission layer may be directly emitted towards the opposite electrode 233; alternatively or additionally, the light emitted by the organic emission layer may be reflected by the pixel electrode 231 towards the opposite electrode 233.

In an embodiment, the organic light-emitting display apparatus 10 may be a bottom-emission-type apparatus, in which light emitted by the organic emission layer may be transmitted towards the substrate 100, the pixel electrode 231 may be a transparent or translucent electrode, and the opposite electrode 233 may be a reflective electrode. In an embodiment, the organic light-emitting display apparatus 10 may be a top-and-bottom-emission-type apparatus, in which light emitted by the organic emission layer may be transmitted toward both the opposite electrode 233 and the substrate 100.

A pixel defining layer 216 formed of an insulating material may be formed on the pixel electrode 231. The pixel defining layer 216 exposes a predetermined region of the pixel electrode 231. The intermediate layer 232, which includes the organic emission layer, may overlap the exposed region of the pixel electrode 231.

The organic emission layer may include a low-molecular organic material or a high-molecular organic material. The intermediate layer 232 may further include one or more function layers, such as one or more of a hole transport layer (HTL), a hole injection layer (HIL), an electron transport layer (ETL), an electron injection layer (EIL), etc., in addition to the organic emission layer.

Referring back to FIG. 1, the encapsulation layer 300 may cover and/or encapsulate the display unit 200, for delaying and/or preventing deterioration of the display unit 200.

The encapsulation layer 300 may include a first organic layer 310, a protective layer 330 formed on the first organic layer 310, and a first inorganic layer 320 that covers the protective layer 330.

The first organic layer 310 may substantially cover the display unit 200. The first organic layer 310 may be formed of a flexible organic material to alleviate an internal stress of the first inorganic layer 320 and/or (for preventing infiltration of external moisture or oxygen) may cover (and/or fill) fine cracks and pinholes of the first inorganic layer 320.

The first inorganic layer 320 may be formed of at least an inorganic material that has desirable moisture-proof or moisture-resistance characteristics. The first inorganic layer 320 may be formed of at least one of $SiN_x$, $Al_2O_3$, $SiO_2$, and $TiO_2$ and may substantially prevent or resist infiltration of moisture and/or oxygen. The first inorganic layer 320 may substantially cover the first organic layer 310 and/or the protective layer 330.

In an embodiment, the encapsulation layer 300 may include alternately stacked organic layers and/or inorganic layers. In an embodiment, the encapsulation layer 300 may include an inorganic layer that may directly contact the display unit 200. The protective layer 330 may protect the first organic layer 310 from plasma and the like. The protective layer 330 may be or may include at least one of an inorganic layer, an organic layer, and a mixed inorganic-organic layer. In an embodiment, the protective layer 330 may include an inorganic layer formed of an inorganic material, such as $SiN_x$, $SiO_x$, or $Al_2O_3$.

The protective layer 330 may define a shape and/or an area of the first organic layer 310. In a manufacturing process, the protective layer 330 may function as a mask for forming the first organic layer 310. In an embodiment, material provided for forming the first organic layer 310 and exposed outside the protective layer 330 may be removed by a removal process, such as ashing or the like.

Therefore, a top surface area of the first organic layer 310 may be substantially equal to or less than a top surface area of the protective layer 330, and a side surface of the protective layer 330 may be substantially flush with and/or aligned with a side surface of the first organic layer 310. According to embodiments of the invention, the protective layer 330 may clearly define a border of the first organic layer 310, and unwanted material(s) provided in the process of forming the first organic layer 310 may be removed. Advantageously, desirable moisture-resistance characteristics of the first organic layer 310 may be provided at edges of the first organic layer 310, and a side moisture-proof/moisture-resistance property of the organic light-emitting display apparatus 10 may be optimized.

Because the first inorganic layer 320 may substantially completely cover the protective layer 330, a top surface area of the protective layer may be less than that of the first inorganic layer 320.

Figure 3:
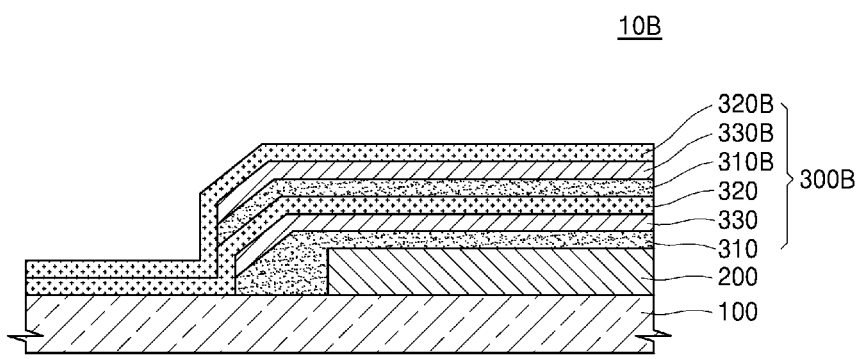
FIG. 3 is a cross-sectional view illustrating a display apparatus (e.g., an organic light-emitting display apparatus) according to an embodiment of the present invention.

FIG. 3 is a cross-sectional view illustrating a display apparatus 10B, e.g., an organic light-emitting display apparatus 10B, according to an embodiment of the present invention.

Referring to FIG. 3, the organic light-emitting display apparatus 10B may include a substrate 100, a display unit 200 formed on the substrate 100, and an encapsulation layer 300B that may substantially encapsulate the display unit 200. The substrate 100 and the display unit 200 in the organic light-emitting display apparatus 10B may be substantially identical to the substrate 100 and the display unit 200 in the organic light-emitting display apparatus 10 described with reference to FIGS. 1 and 2.

The encapsulation layer 300B may include a first organic layer 310, a first inorganic layer 320 (which may substantially cover the first organic layer 310), a second organic layer 310B formed on the first inorganic layer 320, and a second inorganic layer 320B (which may substantially cover the second organic layer 310B).

In an embodiment, the encapsulation layer 300B may include alternately stacked organic layers (e.g., organic layers 310 and 310B) and inorganic layers (e.g., inorganic layers 320 and 320B). The encapsulation layer 300 may further include one or more additional organic layers (in addition to organic layers 310 and 310B) and/or one or more additional inorganic layers (in addition to inorganic layers 320 and 320B). A protective layer 330 may be formed on the first organic layer 310, such that the protective layer 330 may be disposed between the first organic layer 310 and the first inorganic layer 320. The protective layer 330 may function as a mask for removing excess material provided on the substrate in the process of forming the first organic layer 310. Advantageously, encapsulation of the display unit 200 may be optimized.

A second protective layer 330B may be further disposed between the second inorganic layer 320B and the second organic layer 310B. The second protective layer 330B may define a shape and/or a top surface area of the second organic layer 310B. The second protective layer 330B may be formed of a material that is identical to or analogous to the material of the protective layer 330. The second protective layer 330B may perform one or more functions that are identical to or analogous to one or more functions of the protective layer 330. The second protective layer 330B may clearly define a border of the second organic layer 310B, such that unwanted material portions formed in the process of forming the second organic layer 310B may be removed and that encapsulation of the display unit 200 may be optimized.

Figure 4:
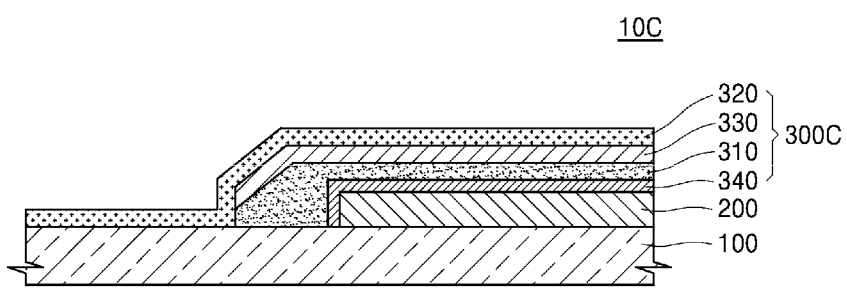
FIG. 4 is a cross-sectional view illustrating a display apparatus (e.g., an organic light-emitting display apparatus) according to an embodiment of the present invention.

FIG. 4 is a cross-sectional view illustrating a display apparatus 10C, e.g., an organic light-emitting display apparatus 10C, according to an embodiment of the present invention. The organic light-emitting display apparatus 10C may include a substrate 100, a display unit 200 formed on the substrate 100, and an encapsulation layer 300C that may substantially encapsulate the display unit 200.

One or more features of the encapsulation layer 300C may be identical to or analogous to one or more features of the encapsulation layer 300 discussed with reference to FIG. 1. The encapsulation layer 300C may include a metal layer 340 formed on the display unit 200, in addition to a first organic layer 310, a first inorganic layer 320 that covers the first organic layer 310, and a protective layer 330 formed on the first organic layer 310. The metal layer 340 may be disposed between the display unit 200 and the first organic layer 340. In forming the encapsulation layer 300C, after the metal layer 340 is provided on the display unit 200, the first organic layer 310, the protective layer 330, and the first inorganic layer 320 are sequentially provided.

The metal layer 340 may cover the display unit 200. The metal layer 340 may include a halogenated metal. The metal layer 340 may be formed of LiF or $AlO_x$. The metal layer 340 may prevent damage of the display unit 200 when the first organic layer 310 on the metal layer 340 is formed by sputtering or plasma deposition.

The organic light-emitting display apparatus 100 may further include elements of the encapsulation layer 300B illustrated in FIG. 3. In an embodiment, the organic light-emitting display apparatus 10C may include a second organic layer 310B, a second protective layer 330B, and a second inorganic layer 320B that are disposed on the encapsulation layer 300C.

FIGS. 5 to 8 are cross-sectional views illustrating a method for manufacturing one or more organic light-emitting display apparatuses (e.g., one or more of the organic light-emitting display apparatus 10, 10B, and 10C illustrated in FIGS. 1 to 4) according to an embodiment of the present invention.

Figure 5:
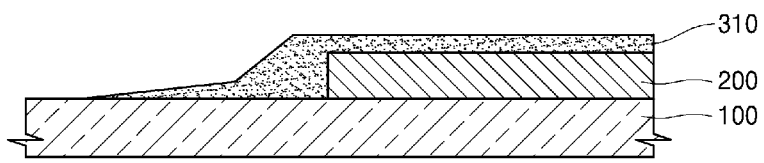
FIGS. 5 to 8 are cross-sectional views illustrating a method for manufacturing a display apparatus (e.g., an organic light-emitting display apparatus) according to an embodiment of the present invention.

Referring to FIG. 5, the display unit 200 and a first organic material layer that may include the first organic layer 310 and an excess portion 313 are formed on the substrate 100. The display unit 200 may have the configuration discussed with reference to FIG. 2. The display unit 200 may include one or more elements of one or more of various known light-emitting units, e.g., one or more organic light-emitting display units.

The first organic layer 310 may be formed of at least one of polyurea, polyacrylate, etc. The first organic layer 310 may be formed by vaporizing a monomer of a liquid phase to produce a vaporized monomer, depositing the vaporized monomer on the substrate 100 to form a deposited monomer, and irradiating ultraviolet rays on the deposited monomer to polymerize the deposited monomer into a polymer.

In an embodiment, before forming the first organic layer 310, a metal layer 340 may be formed to cover the display unit 200. The metal layer 340 may protect the display unit 200 from plasma used in forming an organic layer or an inorganic layer on the metal layer 340.

Figure 6:
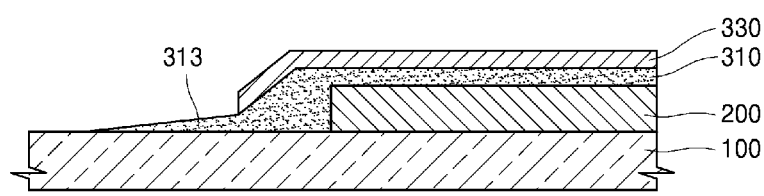

After the first organic material layer has been formed, the protective layer 330 is formed on the first organic material 310, as illustrated in FIG. 6.

The protective layer 330 may be or may include an inorganic layer, an organic layer, and/or an inorganic-organic mixed layer and may protect the first organic layer 310. In an embodiment, the protective layer 330 may be an inorganic layer formed of an inorganic material, such as one of $SiN_x$, $SiO_x$, $Al_2O_3$, etc. The protective layer 330 may be deposited by one or more of sputtering, atomic layer deposition, chemical vapor deposition, etc.

In an embodiment, the protective layer 330 may be configured to function as a mask for shaping the first organic layer 310. The protective layer 330 may be formed on the first organic layer 310 to correspond to a desired top surface area of the first organic layer 310 without covering the excess portion 313.

Figure 7:
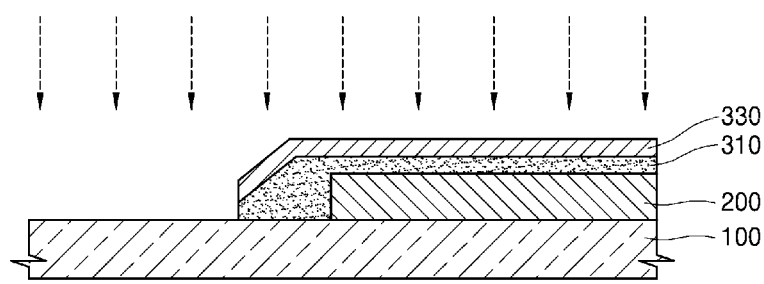

After the protective layer 330 has been formed, the excess portion 313 of the first organic material layer is removed, and the first organic layer 310 remains, as illustrated in FIG. 7.

The excess portion 313 of the first organic layer 310 may be removed by an ashing process. The ashing process is a process of removing C-base organic materials by accelerating a gas, such as one or more of oxygen ($O_2$), nitrogen oxide ($N_2O$), nitrogen hydrate ($NH_3$), etc., in a plasma state to perform dry etching. Since the protective layer 330 may substantially protect the first organic layer 310 in the ashing process, after the ashing process, the first organic layer 310 remains, and the exposed excess portion 313 is removed. Accordingly, a top surface area of the first organic layer 310 may substantially identical to a top surface area of the protective layer 330, and a side surface of the protective layer 330 may be substantially flush with and/or substantially aligned with a side surface of the first organic layer 310. Since the protective layer 330 may substantially precisely define a border of the first organic layer 310, a substantially robust and/or seamless structure of the encapsulation layer that includes the first organic layer may be formed. Advantageously, the display unit 200 may be effectively protected from moisture.

Figure 8:
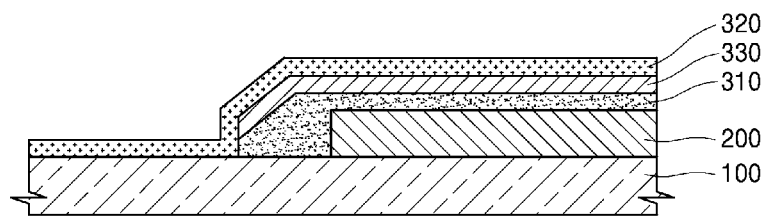

Subsequently, as illustrated in FIG. 8, the first inorganic layer 320 is formed to cover the protective layer 330 and the first organic layer 310. The first inorganic layer 320 may be formed by at least one of sputtering, atomic layer deposition, chemical vapor deposition, etc. The first inorganic layer 320 may include at least one of $SiN_x$, $SiO_x$, $AlO_x$, silicon carbon nitride ($SiC_xN_y$), silicon oxynitride ($SiO_xN_y$), amorphous carbon, indium oxide ($InO_x$), ytterbium oxide ($YbO_x$), etc. The first inorganic layer 320 may include one or more of other materials.

In an embodiment, the first inorganic layer 320 has been formed, a second inorganic layer (e.g., the layer 310B illustrated in FIG. 3) and a second inorganic layer (e.g., the layer 320B illustrated in FIG. 3) may be formed on the inorganic layer 320. In an embodiment, one or more additional organic layers and one or more additional inorganic layers may be further formed on the second inorganic layer 320B. In an embodiment, the second inorganic layer 320B is formed, a second protective layer (e.g., layer 330B illustrated in FIG. 3) for shaping and/or defining an area of the second organic layer 310B may be formed on the second organic layer 310B.

As can be appreciated from the description provided above, according to embodiments of the present invention, organic layers in encapsulation layers may be formed with substantially accurate shapes and/areas. Advantageously, the encapsulation layers may have substantially robust and/or seamless structures that may effectively protect display units from moisture.

The embodiments described above are for illustration and not for limitation. Those of ordinary skill in the art would understand that various changes may be made to the embodiments without departing from the spirit and scope of the present invention as defined by the following claims.

What is claimed is:

1. A display apparatus comprising:
a substrate;
a display unit including an emission layer and disposed on the substrate;
a first protective layer overlapping the display unit; and
a first organic layer disposed between the display unit and the first protective layer,
wherein a top surface area of the first organic layer is equal to or less than a top surface area of the first protective layer,
wherein a first face of the first organic layer is slanted with respect to a surface of the substrate,
wherein a second face of the first organic layer is directly connected to the first face of the first organic layer and is positioned between the substrate and the first face of the first organic layer,
wherein the first organic layer covers a side surface of the display unit, wherein the first protective layer includes a first surface being slanted corresponding to the first face of the first organic layer,
wherein the first surface of the protective layer and the first face of the first organic layer do not overlap the display unit,
wherein an extension line of a top surface of the display unit meets the first surface of the protective layer and the first face of the first organic layer, and
wherein the extension line of a top surface of the display unit is a virtual line extending from the top surface of the display unit.

2. The display apparatus of claim 1, wherein the top surface area of the first organic layer is equal to the top surface area of the first protective layer.

3. The display apparatus of claim 1, wherein a side of the first protective layer is slanted with respect to the substrate.

4. The display apparatus of claim 1, wherein the first protective layer includes at least one of silicon nitride ($SiN_x$), silicon oxide ($SiO_x$), and aluminum oxide ($Al_2O_3$).

5. The display apparatus of claim 1, further comprising a first inorganic layer covering the first protective layer.

6. The display apparatus of claim 5, wherein the first inorganic layer contacts a first portion of the first organic layer, wherein a thickness of the first portion of the first organic layer is less than a thickness of a second portion of the first organic layer in a direction perpendicular to the substrate, and wherein the second portion of the first organic layer is positioned between the display unit and the first portion of the first organic layer.

7. The display apparatus of claim 5, wherein the first protective layer is formed of an inorganic material, wherein the first inorganic layer directly contacts and completely covers a first side of the first protective layer, wherein the first organic layer directly contacts a second side of the first protective layer, and wherein the second side of the first protective layer is opposite the first side of the first protective layer.

8. The display apparatus of claim 5, wherein a portion of the first inorganic layer is slanted with respect to the substrate.

9. The display apparatus of claim 5, further comprising:
a second inorganic layer overlapping the first inorganic layer; and
a second organic layer disposed between the first inorganic layer and the second inorganic layer, wherein the first inorganic layer directly contacts the second inorganic layer.

10. The display apparatus of claim 9, further comprising a second protective layer disposed between the second inorganic layer and the second organic layer, wherein the second inorganic layer contacts the first inorganic layer and the second protective layer.

11. The display apparatus of claim 1, further comprising a metal layer disposed between the display unit and the first organic layer.

12. The display apparatus of claim 11, wherein the metal layer contacts at least two surfaces of the first organic layer.

13. The display apparatus of claim 11, wherein the metal layer includes at least one of lithium fluoride (LiF) and aluminum oxide ($AlO_x$).

14. The display apparatus of claim 1, further comprising an inorganic layer covering the display unit, wherein the inorganic layer covers a side surface of the first protective layer and a side surface of the first organic layer.

15. The display apparatus of claim 14, wherein a region of the inorganic layer directly contacts the substrate.

16. A display apparatus comprising:
a substrate;
a display unit including an emission layer and directly contacting a surface of the substrate;
an inorganic layer covering the display unit;
a protective layer disposed between the display unit and the inorganic layer; and
an organic layer disposed between the display unit and the protective layer and disposed inside a hole of the inorganic layer,
wherein the inorganic layer directly contacts both a first face of the protective layer and a second face of the protective layer,
wherein the first face of the protective layer is slanted with respect to the surface of the substrate, wherein the second face of the protective layer is directly connected to the first face of the protective layer,
wherein the first organic layer includes a first surface directly contacting a face of the inorganic layer,
wherein the first organic layer covers a side surface of the display unit,
wherein the first protective layer includes a first surface being slanted corresponding to a first face of the first organic layer, wherein the first surface of the protective layer and the first face of the first organic layer do not overlap the display unit, wherein an extension line of a top surface of the display unit meets the first surface of the protective layer and the first face of the first organic layer, and wherein the extension line of a top surface of the display unit is a virtual line extending from the top surface of the display unit.

\* \* \* \* \*